(12) United States Patent
Nakatsugawa

(10) Patent No.: US 6,373,405 B1
(45) Date of Patent: Apr. 16, 2002

(54) CONVERSION METHOD, RESTORATION METHOD, CONVERSION DEVICE, AND RESTORATION DEVICE

(75) Inventor: Yoshinori Nakatsugawa, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/419,634

(22) Filed: Oct. 18, 1999

(30) Foreign Application Priority Data

Oct. 19, 1998 (JP) .......................................... 10-297140

(51) Int. Cl.$^7$ ................................................ G06F 15/66
(52) U.S. Cl. .......................................... 341/50; 341/50
(58) Field of Search .................................. 341/118, 120, 341/61, 155, 143

(56) References Cited

U.S. PATENT DOCUMENTS

| | | | | | |
|---|---|---|---|---|---|
| 3,742,199 A | * | 6/1973 | Lubarsky | ................. | 340/174 |
| 3,772,680 A | * | 11/1973 | Kawai et al. | ................ | 340/347 |
| 4,626,826 A | * | 12/1986 | Fukuda et al. | ............... | 340/347 |
| 5,537,112 A | * | 7/1996 | Tsang | ..................... | 341/59 |
| 5,633,632 A | * | 5/1997 | Ido et al. | ....................... | 341/58 |
| 5,781,133 A | * | 7/1998 | Tsang | ..................... | 341/59 |
| 6,211,801 B1 | * | 4/2001 | Girod | .......................... | 341/67 |

FOREIGN PATENT DOCUMENTS

| | | |
|---|---|---|
| EP | 0 123 563 A | 10/1984 |
| EP | 0 138 229 A | 4/1985 |
| JP | 59-200562 | 11/1984 |
| JP | 60-107921 | 6/1985 |

OTHER PUBLICATIONS

K. A. Schouhamer Immink, "Coding Techniques for Digital Recorders", Prentice Hall. New York, pp. 182–185 (1991).

* cited by examiner

*Primary Examiner*—Peguy JeanPierre
(74) *Attorney, Agent, or Firm*—Finnegan, Henderson, Farabow, Garrett & Dunner, L.L.P.

(57) ABSTRACT

The information blocks are converted into the code blocks by dividing the information blocks, which are extracted sequentially from an information sequence and acts as a conversion unit, into a plurality of original subblocks, generating a plurality of inverted subblocks containing inverted information, which are obtained by inverting all original information being allocated to one or more segments contained in original subblocks, while correlating the original subblocks with the inverted subblocks respectively, and converting the information blocks into the code blocks by combining the plurality of original subblocks and the plurality of generated inverted subblocks together. Then, the code blocks derived by conversion are restored to the original information blocks by sampling the original information, which are allocated to one or more segments contained in the original subblocks respectively, from respective original subblocks of the code blocks obtained by the conversion.

12 Claims, 7 Drawing Sheets

CONVERSION METHOD, RESTORATION METHOD, CONVERSION DEVICE, AND RESTORATION DEVICE

BACKGROUND OF THE INVENTION

1. Field of the Invention

The present invention relates to a conversion method employed to convert sequentially information blocks, each of which is extracted sequentially from information sequence and acts as a conversion unit, into code blocks. More particularly, the present invention relates to a conversion method and a conversion device which are capable of converting the information blocks into the code blocks through simple procedures, while taking account of suppression of a direct current component.

The present invention also relates to a restoration method and a restoration device which are optimal to restore the code blocks, which are converted by using the above conversion method, to original information blocks.

2. Description of the Prior Art

In the prior art, in order to remove defects such as restoration error caused due to baseline shift, etc. when information blocks each of which is extracted sequentially from information sequence and acts as a conversion unit are converted sequentially into code blocks, various conversion methods have been known which intend to realize the conversion taking account of suppression of a direct current component.

For example, in Patent Application Publication (KOKAI) Sho 59-200562, a conversion method has been disclosed which intends to realize the conversion while taking suppression of the direct current component into consideration. According to this conversion method, when 8-bit information blocks are converted into 10 bit code blocks, codes in which "1" and "0" are equal or close in number to each other are selected as a code conversion candidate from codes of $2^{10}=1024$ patterns, and then the selected code conversion candidates are allocated to the codes of $2^8=256$ patterns so as to correlate the code conversion candidates with the codes respectively.

Also, for example, in Patent Application Publication (KOKAI) Sho 60-107921, another conversion method has been disclosed which intends to realize the conversion while considering suppression of the direct current component. According to this conversion method, codes with the small bit number are converted into codes with the large bit number, then codes which do not contain the direct current component and which have patterns whose change points of information level are separated by more than two bits, codes which have patterns in which change points of information level are separated by more than two bits but the net positive or negative direct current component is suppressed within the previously determined range, or the like are selected as the code conversion candidate from the latter codes with the large bit number, and then a plurality of selected code conversion candidates are allocated to the codes with the small bit number so as to correlate the code conversion candidates with the codes respectively.

However, such a problem to be solved exists in the above conversion methods in the prior art that procedures required for converting the information blocks into the code blocks while taking account of suppression of the direct current component become complicated.

In other words, according to the conversion method disclosed in Patent Application Publication (KOKAI) Sho 59-200562, because only 193 codes in which "1" and "0" are contained equally in number are present in the codes of $2^{10}=1024$ patterns, 63 patterns of the codes in which "1" and "0" are close in number must also be selected as the code conversion candidate. In this case, further the procedure of compensating difference between "1" and "0" is requested.

As a result, the procedures required to convert the information blocks into the code blocks with considering the suppression of the direct current component become complicated.

In contrast, according to the conversion method disclosed in Patent Application Publication (KOKAI) Sho 60-107921, patterns in which the change points of information level are separated by more than two bits but the net positive or negative direct current component is suppressed within the previously determined range are selected as the code conversion candidate. In this case, the procedure of eliminating the net positive or negative direct current component is further requested. As a result, the procedures required to convert the information blocks into the code blocks with considering the suppression of the direct current component become complicated.

Therefore, interested persons earnestly look forward to development of a new technology which are capable of converting the information blocks into the code blocks through simple procedures while taking account of suppression of the direct current component.

SUMMARY OF THE INVENTION

The present invention has been made in light of the above circumstances and it is an object of the present invention to provide a conversion method and a conversion device which are capable of converting information blocks into code blocks through simple procedures, while taking account of suppression of a direct current component, by dividing information blocks, each of which is extracted sequentially from information sequence and acts as a conversion unit, into a plurality of original subblocks, then generating inverted subblocks containing inverted information, which are obtained by inverting all original information allocated to one or more segments contained in divided original subblocks, while correlating the original subblocks with the inverted subblocks respectively, and then combining together a plurality of original subblocks and a plurality of generated inverted subblocks.

It is another object of the present invention to provide a restoration method and a restoration device which are optimal to restore the code blocks, which are converted by using the above conversion method, to original information blocks.

In order to achieve the above object, there is provided a conversion method of converting sequentially information blocks, each of which is extracted sequentially from an information sequence and acts as a conversion unit, into code blocks, the method comprising the steps of: dividing the information blocks into a plurality of original subblocks; generating a plurality of inverted subblocks containing inverted information, which are obtained by inverting all original information being allocated to one or more segments contained in original subblocks, while correlating the original subblocks with the inverted subblocks respectively; and converting the information blocks into the code blocks by combining the plurality of original subblocks and the plurality of generated inverted subblocks together.

According to the present invention, the information blocks are converted into the code blocks by dividing the information blocks which are extracted sequentially from an information sequence and acts as a conversion unit into a plurality of original subblocks, generating a plurality of inverted subblocks containing inverted information, which are obtained by inverting all original information being allocated to one or more segments contained in original subblocks, while correlating the original subblocks with the inverted subblocks respectively, and converting the information blocks into the code blocks by combining the plurality of original subblocks and the plurality of generated inverted subblocks together. Therefore, the information blocks each serving as a conversion unit are converted into the code blocks in which the original information allocated to every segment contained in the information blocks and the inverted information are combined together such that the numbers of the original information in a block acting as a conversion unit and the inverted information are balanced. As a result, the information blocks can be converted into the code blocks via simple procedures while suppressing the direct current component.

In the preferred embodiment of the present invention, each of the inverted subblocks is inserted between any original subblocks of the plurality of original subblocks when the plurality of original subblocks and the plurality of inverted subblocks are combined together.

In the preferred embodiment of the present invention, each of the inverted subblocks is inserted adjacent to the corresponding original subblock of the plurality of original subblocks when the plurality of original subblocks and the plurality of inverted subblocks are combined together.

In order to achieve the above object, there is provided a restoration method of restoring code blocks into original information blocks, the code blocks being converted from information blocks by dividing the information blocks each of which is extracted sequentially from the information sequence and acts as a conversion unit into a plurality of original subblocks, then generating a plurality of inverted subblocks containing inverted information which are obtained by inverting all original information being allocated to one or more segments contained in the original subblocks respectively while correlating the original subblocks with the inverted subblocks, and then combining the plurality of original subblocks and the plurality of generated inverted subblocks together, the method comprising the step of: restoring the code blocks derived by conversion to the original information blocks by sampling the original information, which are allocated to one or more segments contained in the original subblocks respectively, from respective original subblocks of the code blocks obtained by the conversion.

According to the present invention, the code blocks derived by conversion are restored to the original information blocks by sampling the original information, which are allocated to one or more segments contained in the original subblocks respectively, from respective original subblocks of the code blocks obtained by the conversion. Therefore, the restoration method which is optimal to restore the code blocks converted by using the above conversion method to the original information blocks can be achieved.

In the preferred embodiment of the present invention, the restoration method further comprises the steps of: sampling the inverted information, which are allocated to one or more segments contained in the inverted subblocks respectively, from respective inverted subblocks of the code blocks; executing coincidence decision to decide whether or not at least one combination in which both information coincide with each other is present in a plurality of combinations of the sampled original information and the sampled inverted information corresponding to the sampled original information; and deeming that an abnormal condition is caused when it is decided according to result of the coincidence decision that at least one combination in which both information coincide with each other is present.

According to this embodiment, when it is decided according to result of the coincidence decision that at least one combination in which both information coincide with each other is present, generation of the abnormal condition is deemed by sampling the inverted information, which are allocated to one or more segments contained in the inverted subblocks respectively, from respective inverted subblocks of the code blocks, and executing coincidence decision to decide whether or not at least one combination in which both information coincide with each other is present in a plurality of combinations of the sampled original information and the sampled inverted information corresponding to the sampled original information. Therefore, for example, if a request for providing the effect as to the generation of any abnormal condition from the sender to the destination is generated when the code blocks converted by the first conversion device are transmitted via the transmission line, the sender can inform the destination of the generation of the abnormal condition without fail by including forcibly at least one combination, in which the original information and the corresponding inverted information coincide with each other, into the code blocks on the sender side.

In the preferred embodiment of the present invention, the abnormal state contains transmission error and restoration error.

According to this embodiment, the abnormal state contains transmission error and restoration error. In this case, as the result that generation of the code error such as the transmission error, the restoration error, etc. is assumed when the combinations in which the original information and the corresponding inverted information coincide with each other are present, the restoring device which makes it possible to detect the code error easily can be achieved.

Also, in order to achieve the above object, there is provided a conversion device for converting sequentially information blocks, each of which is extracted sequentially from an information sequence and acts as a conversion unit, into code blocks, the device comprising: a dividing means for dividing the information blocks into a plurality of original subblocks; a generating means for generating a plurality of inverted subblocks containing inverted information, which are obtained by inverting all original information being allocated to one or more segments contained in original subblocks, while correlating the original subblocks with the inverted subblocks respectively; and a combining means combining the plurality of original subblocks and the plurality of generated inverted subblocks together to convert the information blocks into the code blocks.

According to this embodiment, first the dividing means divides the information blocks into a plurality of original subblocks. Then, the generating means generates a plurality of inverted subblocks containing inverted information, which are obtained by inverting all original information being allocated to one or more segments contained in original subblocks, while correlating the original subblocks with the inverted subblocks respectively. Then, the combining means combines the plurality of original subblocks and the plurality of generated inverted subblocks together to convert the information blocks into the code blocks.

In this manner, according to this embodiment, the information blocks each serving as a conversion unit are converted into the code blocks in which the original information allocated to every segment contained in the information blocks and the inverted information are combined together, and thus the original information in a block acting as a conversion unit and the inverted information are balanced in number. As a result, while taking suppression of the direct current component into consideration, the information blocks can be converted into the code blocks through simple procedures.

In the preferred embodiment of the present invention, the combining means inserts each of the inverted subblocks between any original subblocks of the plurality of original subblocks when combining the plurality of original subblocks and the plurality of inverted subblocks together.

In the preferred embodiment of the present invention, the combining means inserts each of the inverted subblocks adjacent to the corresponding original subblock of the plurality of original subblocks when combining the plurality of original subblocks and the plurality of inverted subblocks together.

Also, in order to achieve the above object, there is provided a restoration device for restoring code blocks into original information blocks, the code blocks being converted from information blocks by dividing the information blocks each of which is extracted sequentially from the information sequence and acts as a conversion unit into a plurality of original subblocks, then generating a plurality of inverted subblocks containing inverted information which are obtained by inverting all original information being allocated to one or more segments contained in the original subblocks respectively while correlating the original subblocks with the inverted subblocks, and then combining the plurality of original subblocks and the plurality of generated inverted subblocks together, the device comprising: an original information sampling means for sampling the original information, which are allocated to one or more segments contained in the original subblocks respectively, from respective original subblocks of the code blocks obtained by the conversion.

According to this embodiment, the original information sampling means restores the code blocks each serving as the restoration unit to the original information blocks by sampling the original information, which are allocated to one or more segments contained in the original subblocks respectively, from respective original subblocks of the code blocks obtained by the conversion. Therefore, the restoration device which is optimal to restore the code blocks converted by using the above conversion method to the original information blocks can be achieved.

In the preferred embodiment of the present invention, the restoration device further comprises: an inverted information sampling means for sampling the inverted information, which are allocated to one or more segments contained in the inverted subblocks respectively, from respective inverted subblocks of the code blocks; and a coincidence deciding means for executing coincidence decision to decide whether or not at least one combination in which both information coincide with each other is present in a plurality of combinations of the original information sampled by the original information sampling means and the inverted information sampled by the inverted information sampling means corresponding to the original information; wherein generation of an abnormal condition is deemed when it is decided according to result of the coincidence decision made by the coincidence deciding means that at least one combination in which both information coincide with each other is present.

According to this embodiment, the inverted information sampling means samples the inverted information, which are allocated to one or more segments contained in the inverted subblocks respectively, from respective inverted subblocks of the code blocks. Then, the coincidence deciding means executes coincidence decision to decide whether or not at least one combination in which both information coincide with each other is present in a plurality of combinations of the original information sampled by the original information sampling means and the inverted information sampled by the inverted information sampling means corresponding to the original information. Thus, generation of an abnormal condition is deemed when it is decided according to result of the coincidence decision made by the coincidence deciding means that at least one combination in which both information coincide with each other is present. Therefore, for example, if a request for providing the effect as to the generation of any abnormal condition from the sender to the destination is generated when the code blocks converted by the first conversion device are transmitted via the transmission line, the sender can inform the destination of the generation of the abnormal condition without fail by including forcibly at least one combination, in which the original information and the corresponding inverted information coincide with each other, into the code blocks on the sender side.

In the preferred embodiment of the present invention, the abnormal state contains transmission error and restoration error.

According to this embodiment, the abnormal state contains transmission error and restoration error. In this case, as the result that generation of the code error such as the transmission error, the restoration error, etc. is assumed when at least one combination in which the original information and the corresponding inverted information coincide with each other is present, the restoring device which makes it possible to detect the code error easily can be achieved.

The nature, principle and utility of the invention will become more apparent from the following detailed description when read in conjunction with the accompanying drawings.

DESCRIPTION OF THE PREFERRED EMBODIMENTS

Figure 1:
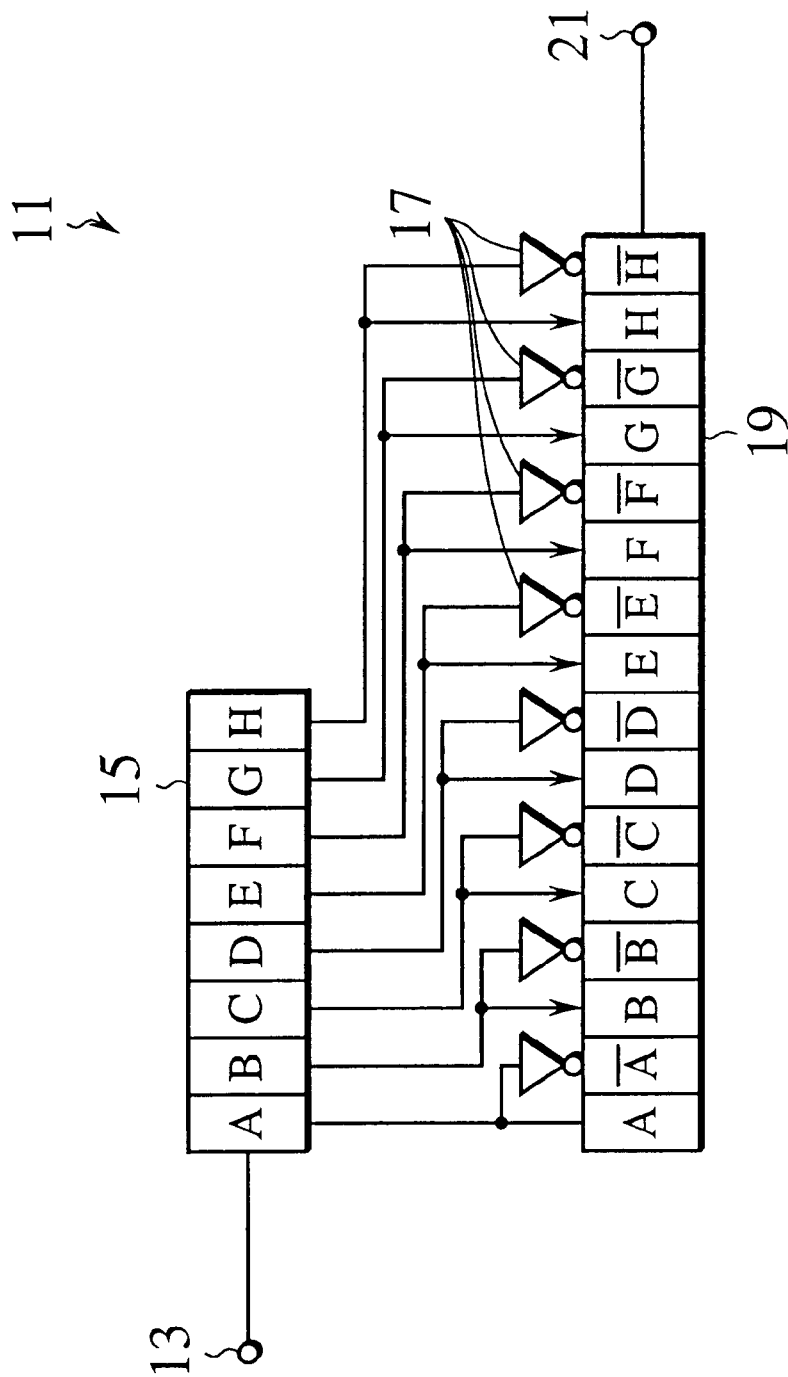
FIG. 1 is a view showing a configuration of a functional block representing a first conversion device according to the present invention.

A conversion method, a restoration method, a conversion device, and a restoration device according to respective embodiments of the present invention will be explained in detail with reference to the accompanying drawings hereinafter.

First, an outline of a conversion method according to the present invention will be explained hereinbelow. This conversion method is employed to convert information blocks, each of which is extracted sequentially from information sequence and acts as a conversion unit, sequentially into code blocks respectively.

In more detail, a feature of the conversion method of the present invention resides in that the information blocks can be converted into the code blocks by dividing the information blocks, each of which is extracted sequentially from the information sequence and acts as a conversion unit, into a plurality of original subblocks, then generating inverted subblocks containing inverted information, which are obtained by inverting all original information allocated to one or more segments contained in divided original subblocks, while correlating the original subblocks with the inverted subblocks respectively, and then combining a plurality of original subblocks and a plurality of generated inverted subblocks together.

According to the conversion method of the present invention, because the information blocks each acting as a conversion unit are converted into code blocks in which original information, which are allocated to every segment contained in the information blocks, and their inverted information are combined together, the original information in a block acting as a conversion unit and the inverted information can be balanced in number mutually. As a result, it is possible to convert the information blocks into the code blocks through simple procedures, while taking account of suppression of the direct current component.

In this event, as a variation of the conversion method of the present invention, it is assumed that, upon combining a plurality of original subblocks and a plurality of generated inverted subblocks together, a plurality of inverted subblocks are not precluded from being inserted between any original subblocks out of the plurality of original subblocks respectively.

Next, an outline of a restoration method according to the present invention will be explained hereinbelow. This restoration method is employed to restore the code blocks converted from the information blocks into the original information blocks by dividing the information blocks, each of which is extracted sequentially from the information sequence and acts as a conversion unit, into a plurality of original subblocks, then generating inverted subblocks containing inverted information, which are obtained by inverting all original information allocated to one or more segments contained in the divided original subblocks, while correlating the original subblocks with the inverted subblocks respectively, and then combining a plurality of original subblocks and a plurality of generated inverted subblocks together.

In more detail, a feature of the restoration method of the present invention resides in that the code blocks being derived by the conversion can be restored into the original information blocks by sampling the original information, which are allocated to one or more segments contained in the original subblocks respectively, from respective original subblocks of the code blocks obtained by the conversion.

According to the restoration method of the present invention, it is feasible to achieve a restoration method which is optimal to employ in restoring the code blocks which are converted by using-the above conversion method to the original information blocks.

Now a correspondence between the above conversion method according to the present invention and both a first conversion device 11 and a second conversion device 51 described hereunder will be discussed hereunder. That is, the first conversion device 11 and the second conversion device 51 can be constructed by embodying the conversion method according to the present invention with mutually different configurations. Similarly, a conversion device according to another embodiment of the present invention can be constructed by embodying the conversion method according to the present invention with a configuration which is different from those of the first conversion device 11 and the second conversion device 51. However, since the conversion device according to another embodiment has a configuration similar to those of the first conversion device 11 and the second conversion device 51, its illustration and explanation will be omitted in this disclosure.

Next, a schematic configuration of the first conversion device 11 according to the present invention will be explained with reference to FIG. 1 hereunder. The first conversion device 11 comprises an information input terminal 13 for sequentially inputting in serial the information blocks each of which is extracted sequentially from information sequence and acts as a conversion unit, a serial/parallel converter (referred to as an "S/P converter" hereinafter) 15 acting as a dividing means, a plurality of NOT circuits 17 each acting as a generating means to execute a logical NOT operation, a parallel/serial converter (referred to as an "P/S converter" hereinafter) 19 acting as a combining means, and a code output terminal 21 for sequentially outputting in serial information allocated to every segment contained in the code blocks.

The S/P converter 15 divides 8-bit information blocks, for example, which are input serially via the information input terminal 13, into eight original subblocks A, B, C, . . . , H having a equal size and has a serial/parallel converting function for outputting original information, which are allocated to every segment contained in the original subblocks A, B, C, . . . , H, in parallel.

Each of a plurality of NOT circuits 17 has a generating function for generating inverted subblocks containing inverted information, which are obtained by inverting all original information, while correlating the original subblocks with the inverted subblocks respectively. Such all original information are allocated to every segment contained in the divided original subblocks A, B, C, . . . , H, which are divided by the S/P converter 15.

Figure 3:
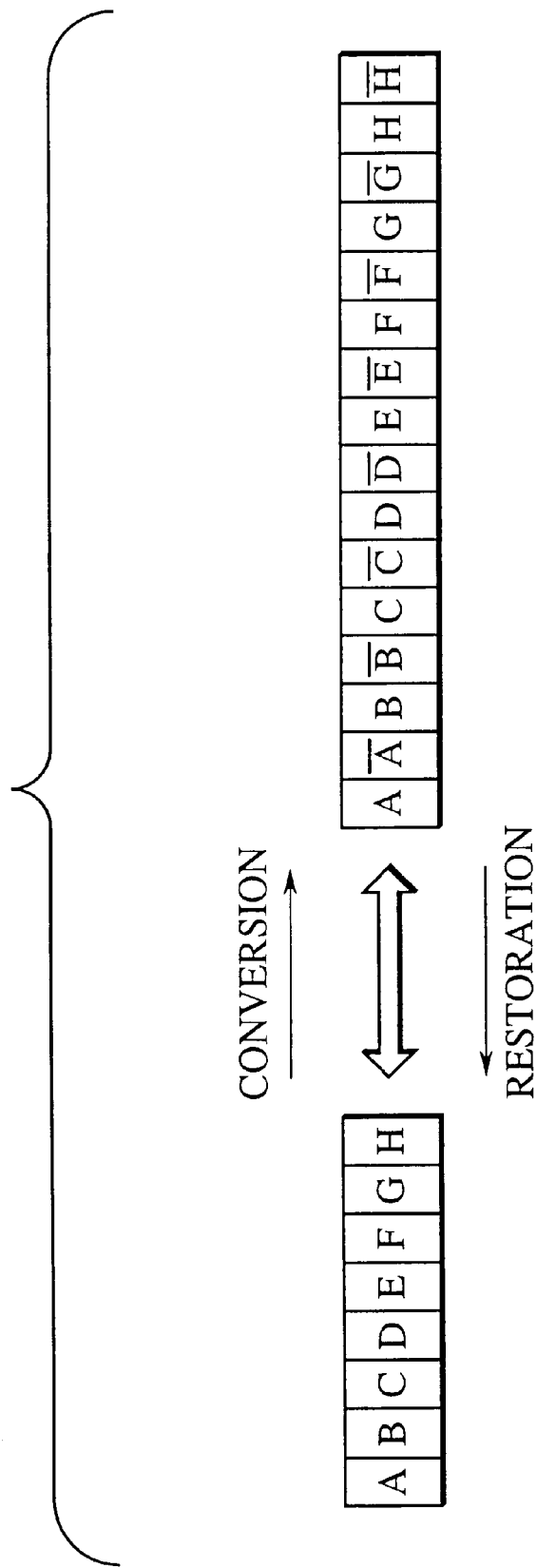
FIG. 3 is a view showing blocks each converted or restored by the first conversion device or the first restoration device according to the present invention.

The P/S converter 19 has a combining function for combining a plurality of original subblocks A, B, C, . . . , H with a plurality of inverted subblocks, which are generated by a plurality of NOT circuits 17, together to thus convert 8-bit information blocks into 16-bit code blocks. The information allocated to every segment contained in the combined code blocks are output serially via the code output terminal 21. More particularly, the P/S converter 19 is constructed to insert each inverted information corresponding to each original information into a next position adjacent to each original information such that the inverted information are correlated with the original information, which are allocated to every segment contained in a plurality of original subblocks A, B, C, . . . , H, respectively. As a result, after converted by the first conversion device 11, the information in the code blocks are aligned such that, as shown in FIG. 3, the original information and the inverted information corresponding to the original information are positioned alternatively.

Next, an operation of the first conversion device 11 constructed as above will be explained hereunder. In the first conversion device 11, at first the S/P converter 15 divides 8-bit information blocks, which are input serially via the information input terminal 13 and each of which acts as a conversion unit, into eight equal original subblocks A, B, C, . . . , H and then outputs in parallel the original information, which are allocated to every segment contained in the original subblocks A, B, C, . . . , H, respectively.

Then, each of a plurality of NOT circuits 17 generates the inverted subblocks containing inverted information, which are obtained by inverting all-original information, while correlating the original subblocks A, B, C, . . . , H with the inverted subblocks respectively. All original information are allocated to every segment contained in the original subblocks A, B, C, . . . , H, which are divided by the S/P converter 15.

Then, the P/S converter 19 combines a plurality of original subblocks A, B, C, . . . , H with a plurality of inverted subblocks, which are generated by a plurality of NOT circuits 17, together to thus convert the 8-bit information blocks into the 16-bit code blocks. Then, the information allocated to every segment contained in the combined code blocks are output serially via the code output terminal 21.

Consequently, according to the first conversion device 11, the information blocks each serving as a conversion unit are converted into the code blocks in which the original information allocated to every segment contained in the information blocks and the inverted information are combined together such that the numbers of the original information in a block acting as a conversion unit and the inverted information are balanced. As a result, the information blocks can be converted into the code blocks via simple procedures while suppressing the direct current component.

Figure 2:
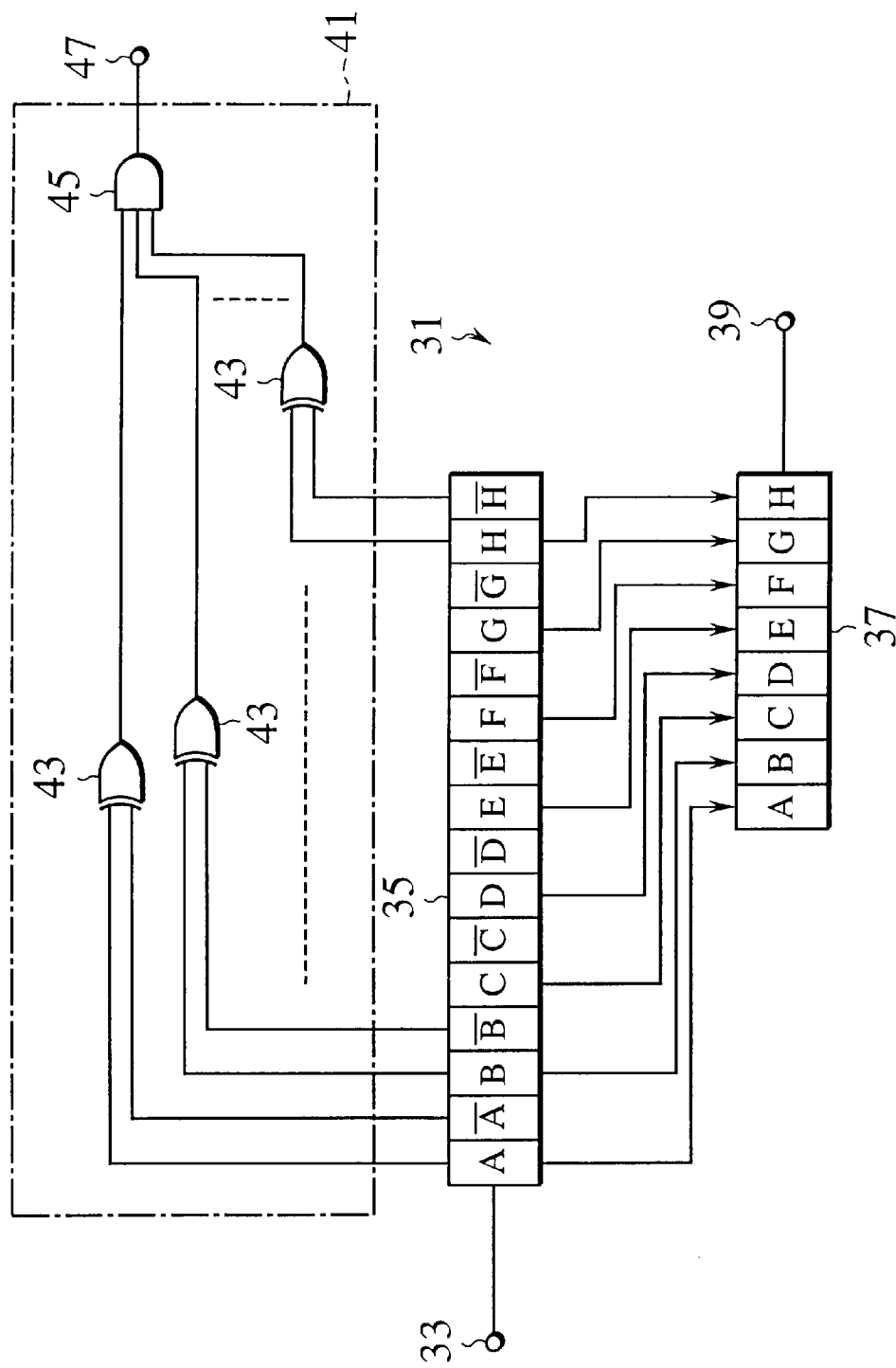
FIG. 2 is a view showing a configuration of a functional block representing a first restoration device for restoring code blocks, which are obtained by the conversion using the first conversion device according to the present invention, to original information blocks.

A schematic configuration of a first restoration device 31 according to the present invention will be explained with reference to FIG. 2 hereunder. The first restoration device 31 comprises a code input terminal 33 for inputting sequentially the code blocks which are extracted sequentially from the code sequence, which are converted by the first conversion device 11 and then sent out via a transmission line (not shown), for example, and each of which acts as a restoration unit; an S/P converter 35 for storing once the information, which are allocated to each segment contained in the 16-bit code blocks being input serially via the code input terminal 33, for example, and then outputting stored information in parallel by distributing such stored information to a P/S converter 37 and an error detection circuit 41 both described later; a P/S converter 37 serving as an original information sampling means; an information output terminal 39 for outputting serially the original information which are allocated to every segment contained in the original information blocks restored by the P/S converter 37; and an error detection circuit 41 serving as the original information sampling means, an inverted information sampling means, and a coincidence deciding means.

The P/S converter 37 has an original information sampling function for sampling the original information, which are allocated to every segment contained in the original subblocks, from each of the original subblocks of the code blocks which are stored in the S/P converter 35 and each of which serves as a restoration unit. More particularly, the P/S converter 37 is constructed to restore the code blocks to the original information blocks by sampling selectively the original information from the information which are stored in the S/P converter 35 and contain the original information and the inverted information.

The error detection circuit 41 is composed of a plurality of exclusive OR circuits 43 for executing an exclusive OR operation respectively, and an AND circuit 45 for executing an AND operation of outputs from a plurality of exclusive OR circuits 43. An output of the AND circuit 45 is output via a state output terminal 47.

A plurality of exclusive OR circuits 43 have an original information sampling function and an inverted information sampling function. The information sampling function samples the original information, which are allocated to every segment contained in the original subblocks, from each of the original subblocks of the code blocks which are stored in the S/P converter 35 and serve as a restoration unit respectively. The inverted information sampling function samples the inverted information, which are allocated to every segment contained in the inverted subblocks, from each of the inverted subblocks of the code blocks each acting as a restoration unit. More particularly, each of the plurality of exclusive OR circuits 43 is constructed to verify coincidence between the original information and the corresponding inverted information by sampling selectively a combination of mutually corresponding information from the information, which are stored in the S/P converter 35 and contain the original information and the inverted information, and then executing the exclusive OR operation of the information contained in the sampled combination.

The AND circuit 45 has a coincidence deciding function for executing a coincidence decision to decide whether or not at least one combination in which both the original information and the inverted information coincide with each other is present in the combinations of the original information and the corresponding inverted information. More particularly, the AND circuit 45 is constructed to decide whether or not at least one combination in which both the original information and the inverted information coincide with each other exists, by applying the logical product operation to the result of the exclusive OR operation which is output from each of a plurality of exclusive OR circuits 43.

Next, an operation of the first restoration device 31 constructed as above will be explained hereunder. In the first restoration device 31, at first the S/P converter 35 stores once the information, which are allocated to every segment contained in the 16-bit code blocks being input serially via the code input terminal 33, for example, and then outputs stored information in parallel by distributing such stored information to the P/S converter 37 and the error detection circuit 41.

Then, the P/S converter 37 restores the code blocks to the original information blocks by sampling the original information, which are allocated to every segment contained in the original subblocks, from each of the original subblocks of the code blocks which are stored in the S/P converter 35 and each of which serves as a restoration unit, and then outputs the restored information via the information output terminal 39.

Therefore, according to the first restoration device 31, a restoration device which is optimal to restore the code blocks obtained by the conversion into the original information blocks can be achieved.

In the meanwhile, in the error detection circuit 41, each of a plurality of exclusive OR circuits 43 verifies the coincidence between the original information and the corresponding inverted information by sampling selectively a combination of mutually corresponding information from the information which are stored in the S/P converter 35 and contain the original information and the inverted information, and then executing the exclusive OR operation of the information contained in the sampled combination. More particularly, the exclusive OR circuits 43 output "1" when the information contained in the combination are different like "0" and "1", and output "0" when the information contained in the combination coincide mutually like "1" and "1", or "0" and "0". As a result, error occurring locations, in which the original information and the corresponding inverted information coincide with each other, can be identified easily by monitoring respective outputs from a plurality of exclusive OR circuits 43.

Based on the results of the exclusive OR operation being output from the plurality of exclusive OR circuits 43, the AND circuit 45 executes the coincidence decision to decide whether or not at least one combination in which the original information coincide with the corresponding inverted information is present, by executing the AND operation of the results of the exclusive OR operation. Then, this result of the coincidence decision, i.e., the error detection result is output via the state output terminal 47. In other words, since the AND circuit 45 outputs "1" under the normal condition and outputs "0" under the abnormal condition, the effect of generation of the abnormal condition can be easily recognized by monitoring this output.

According to the result of the above coincidence decision, if it is decided that at least one combination in which the original information coincide with the corresponding inverted information is present, i.e., if the error occurring locations in which the original information and the corresponding inverted information coincide with each other are present, the first restoration device 31 deems that the abnormal condition is caused, and then outputs such effect.

Therefore, for example, if a request for providing the effect as to the generation of any abnormal condition from the sender to the destination is generated when the code blocks converted by the first conversion device 11 are transmitted via the transmission line, the sender can inform the destination of the generation of the abnormal condition without fail by including forcibly at least one combination, in which the original information and the corresponding inverted information coincide with each other, into the code blocks on the sender side.

The transmission error and the restoration error are contained in the abnormal condition. In this case, as the result that generation of the code error such as the transmission error, the restoration error, etc. is assumed when at least one combination in which the original information and the corresponding inverted information coincide with each other is present, the restoring device which makes it possible to detect the code error easily can be achieved.

As a particular example of the error detecting process, in addition to the above monitoring of the outputs of a plurality of exclusive OR circuits 43 and the output of the AND circuit 45, for example, the error detecting process can also be accomplished by counting the numbers of the original information and the inverted information respectively because the original information and the inverted information, which are contained in the code block acting as the restoration unit are balanced in number.

Furthermore, in addition to the above error detecting processes, the higher precision error detecting process can be realized if the already known cyclic redundancy check (CRC), the parity check, etc. are applied in combination.

In response to the above error detection result, in an error code correction circuit (not shown), for example, the error code correcting process is applied to the error occurring locations in which the original information and the corresponding inverted information coincide with each other.

Here, as a particular error code correcting process, for example, in view of the fact that the original information and the inverted information which are contained in the code block acting as the restoration unit are balanced in number, it is possible to identify that the error is caused in either the original information or the inverted information, by referring to both the code error locations detected by the error detecting process and the counted result of the numbers of the original information and the inverted information. Then, the error code correcting process for correcting the false information can be carried out based on this identification result.

Next, schematic configurations of the second conversion device 51 and a second restoration device 61 according to the present invention will be explained hereunder. In this case, the same reference symbols are affixed to members which have common functions between the first conversion device 11, the first restoration device 31 and the second conversion device 51, the second restoration device 61, and therefore their detailed explanation will be omitted.

Figure 4:
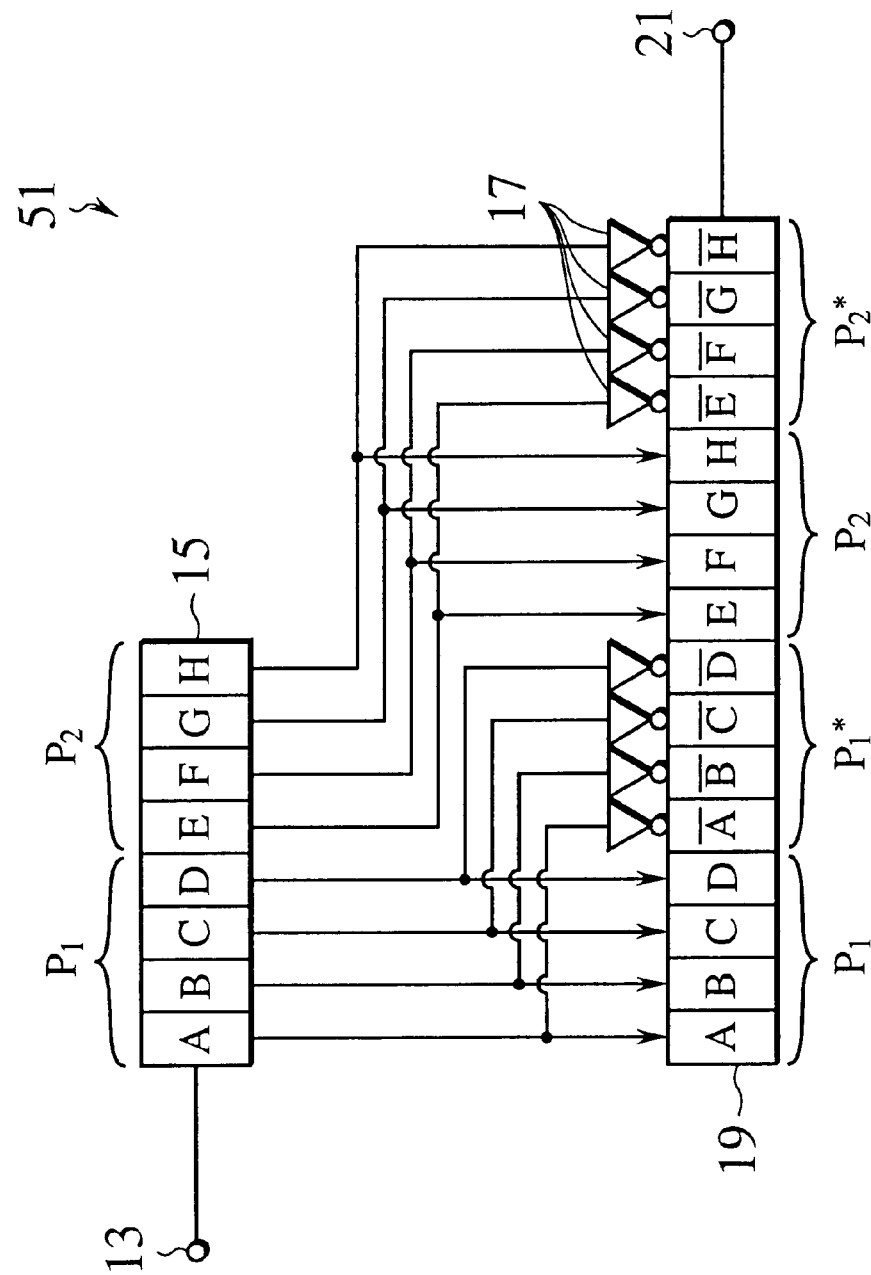
FIG. 4 is a view showing a configuration of a functional block representing a second conversion device according to the present invention.

To begin with, a schematic configuration of the second conversion device 51 according to the present invention will be explained with reference to FIG. 4 hereunder. The second conversion device 51 comprises the information input terminal 13, the S/P converter 15, a plurality of NOT circuits 17, the P/S converter 19, and the code output terminal 21.

The S/P converter 15 divides 8-bit information blocks, for example, which are input serially via the information input terminal 13, into two original subblocks $P_1$, $P_2$ having a equal size, and has a serial/parallel converting function for outputting the original information, which are allocated to every segment contained in the original subblocks $P_1$, $P_2$, in parallel.

Each of a plurality of NOT circuits 17 has a generating function for generating inverted subblocks $P_1^*$, $P_2^*$ containing inverted information, which are obtained by inverting all original information, while correlating the original subblocks $P_1$, $P_2$ with the inverted subblocks $P_1^*$, $P_2^*$ respectively. Such all original information are allocated to every segment contained in the original subblocks $P_1$, $P_2$, which are divided by the S/P converter 15.

Figure 6:
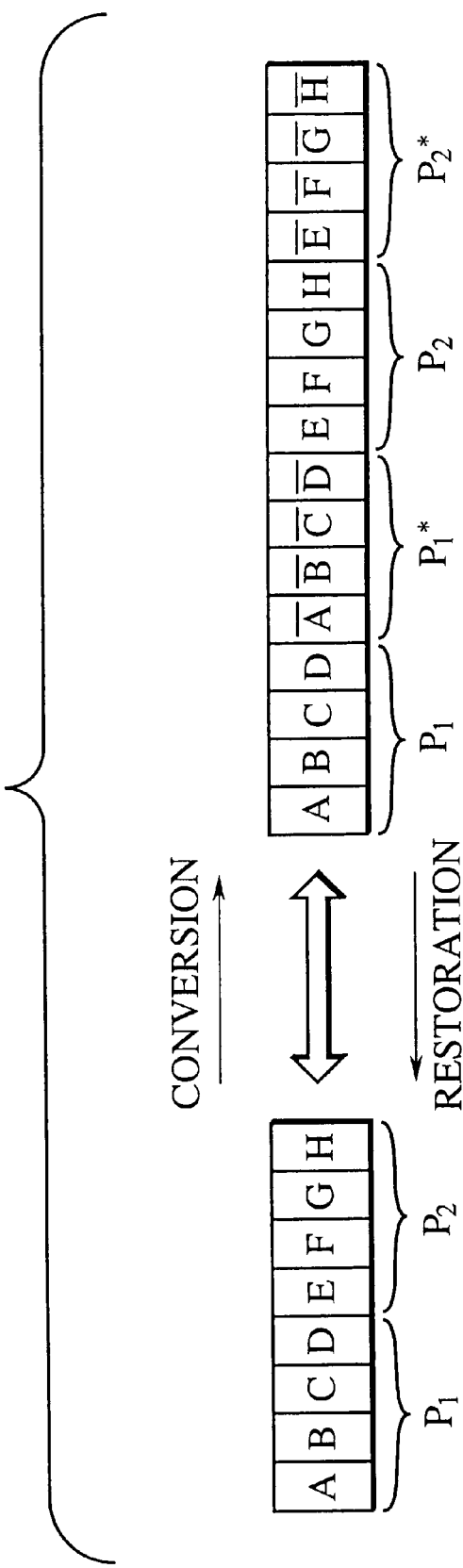
FIG. 6 is a view showing blocks each converted or restored by the second conversion device or the second restoration device according to the present invention.

The P/S converter 19 has a combining function for combining a plurality of original subblocks $P_1$, $P_2$ with a plurality of inverted subblocks $P_1^*$, $P_2^*$, which are generated by a plurality of NOT circuits 17, together to thus convert the 8-bit information blocks into the 16-bit code blocks. The information allocated to every segment contained in the combined code blocks are output serially via the code output terminal 21. More particularly, the P/S converter 19 is constructed to insert each of a plurality of concerned inverted subblocks $P_1^*$, $P_2^*$ into a next position adjacent to each of the original subblocks $P_1$, $P_2$ such that the inverted subblocks $P_1^*$, $P_2^*$ are correlated with a plurality of original subblocks $P_1$, $P_2$ respectively. As a result, after converted by the second conversion device 51, the information in the code blocks are aligned such that, as shown in FIG. 6, the original subblocks $P_1$, $P_2$ and the inverted subblocks $P_1^*$, $P_2^*$ corresponding to the original subblocks $P_1$, $P_2$ are positioned alternatively.

Next, an operation of the second conversion device 51 constructed as above will be explained hereunder. In the second conversion device 51, at first the S/P converter 15 divides the 8-bit information blocks, which are input serially via the information input terminal 13 and each of which acts as a conversion unit, into two equal original subblocks $P_1$, $P_2$ and then outputs in parallel the original information, which are allocated to every segment contained in the original subblocks $P_1$, $P_2$, respectively.

In answer to this, each of a plurality of NOT circuits 17 generates the inverted subblocks $P_1^*$, $P_2^*$ containing inverted information, which are obtained by inverting all original information, while correlating the original subblocks $P_1$, $P_2$ with the inverted subblocks $P_1^*$, $P_2^*$ respectively. All original information are allocated to every segment contained in the original subblocks $P_1$, $P_2$ which are divided by the S/P converter 15.

Then, the P/S converter 19 combines a plurality of original subblocks $P_1$, $P_2$ with a plurality of inverted subblocks $P_1^*$, $P_2^*$, which are generated by a plurality of NOT circuits 17, together to thus convert the 8-bit information blocks into the 16-bit code blocks. Then, the information allocated to every segment contained in the combined code blocks are output serially via the code output terminal 21.

As a consequence, according to the second conversion device 51, like the first conversion device 11, the information blocks each serving as a conversion unit are converted into the code blocks in which the original information allocated to every segment contained in the information blocks and the inverted information are combined together, and thus the original information in a block acting as a conversion unit and the inverted information are balanced in number. As a result, while taking suppression of the direct current component into consideration, the information blocks can be converted into the code blocks through simple procedures.

Figure 5:
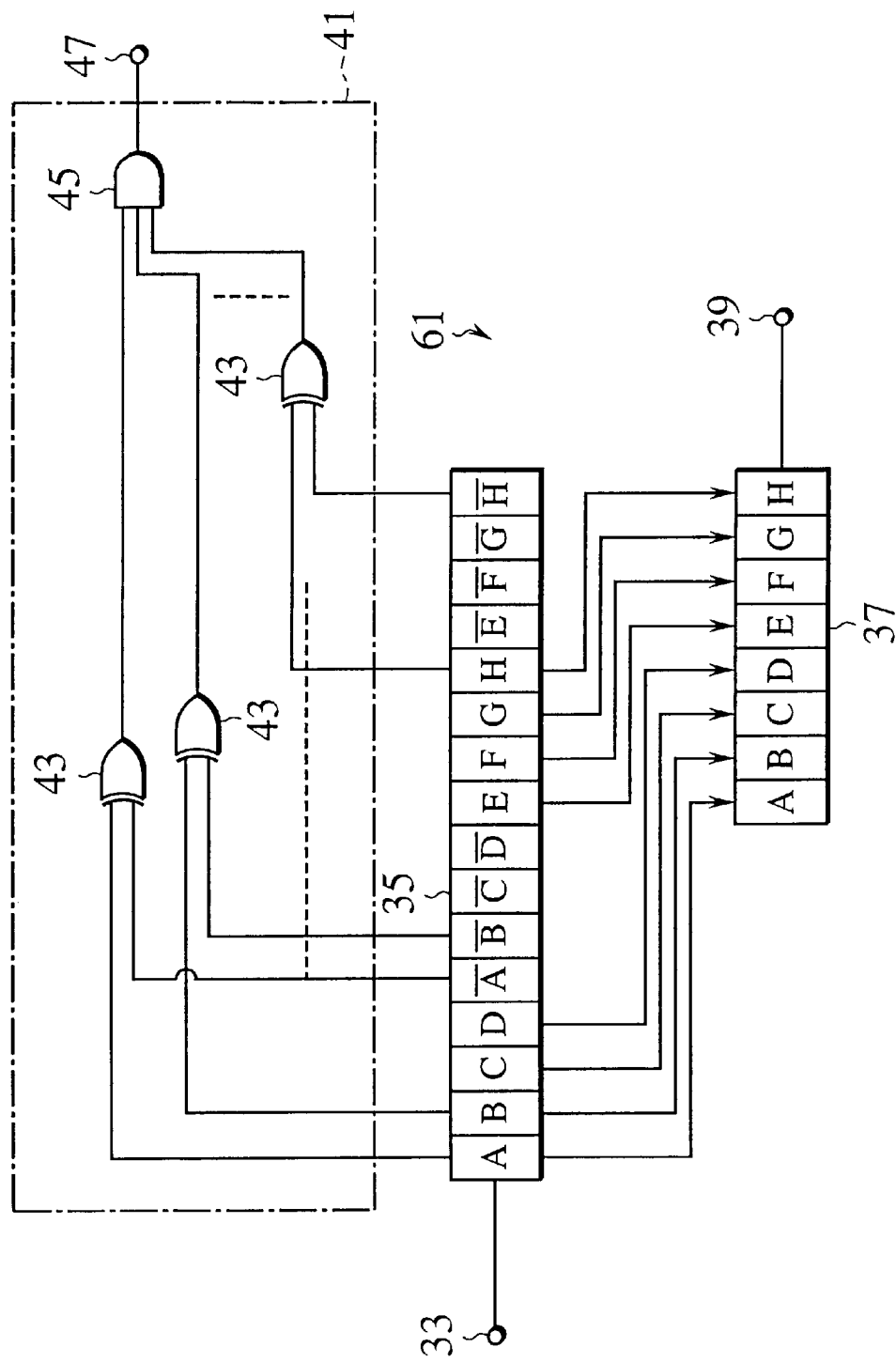
FIG. 5 is a view showing a configuration of a functional block representing a second restoration device for restoring code blocks, which are obtained by the conversion using the second conversion device according to the present invention, to original information blocks.

A schematic configuration of a second restoration device 61 according to the present invention will be explained with reference to FIG. 5 hereunder. The second restoration device 61 comprises the code input terminal 33, the S/P converter 35, the P/S converter 37, the information output terminal 39, and the error detection circuit 41.

The P/S converter 37 is constructed to restore the code blocks to the original information blocks by sampling selectively the original information from the information which are stored in the S/P converter 35 and contain the original information and the inverted information.

The error detection circuit 41 is constructed to include a plurality of exclusive OR circuits 43, and the AND circuit 45. The output of the AND circuit 45 is output via the state output terminal 47.

Next, an operation of the second restoration device 61 constructed as above will be explained hereunder. In the second restoration device 61, at first the S/P converter 35 stores once the information, which are allocated to every segment contained in the 16-bit code blocks being input serially via the code input terminal 33, for example, and then outputs stored information in parallel to distribute such stored information to the P/S converter 37 and the error detection circuit 41.

In response to this, the P/S converter 37 restores the code blocks to the original information blocks by sampling the original information, which are allocated to every segment contained in the original subblocks $P_1$, $P_2$, from each of the original subblocks $P_1$, $P_2$ of the code blocks which are stored in the S/P converter 35 and each of which serves as a restoration unit, and then outputs the restored information via the information output terminal 39.

Therefore, according to the second restoration device 61, like the first restoration device 31, a restoration device which is optimal to restore the code blocks obtained by the conversion into the original information blocks can be achieved.

Meanwhile, since the operation and the advantages of the error detection circuit 41 are similar to those of the first restoration device 31, their redundant explanation will be omitted.

Figure 7A:
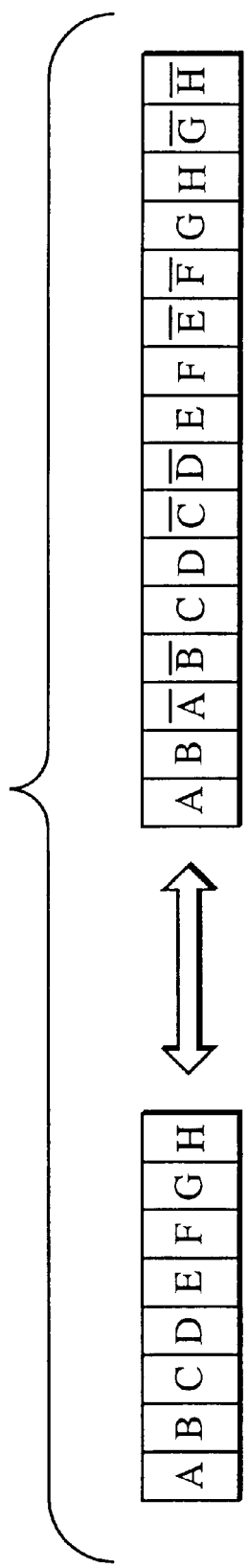
FIGS. 7A and 7B are views showing blocks each converted or restored by a conversion device or a restoration device according to another embodiment of the present invention respectively.
Figure 7B:
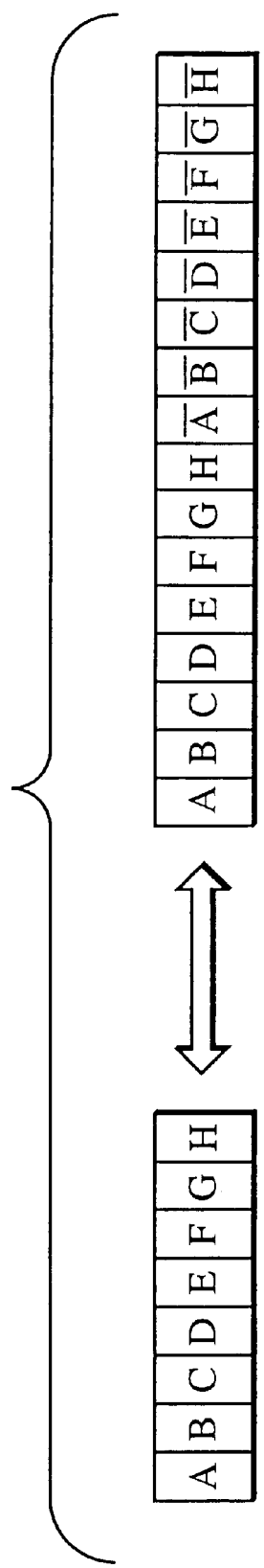

In addition, according to a conversion device or a restoration device according to another embodiment of the present invention, as shown in FIGS. 7A and 7B, predetermined conversion or restoration can be achieved by using the same procedures as those in the conversion devices and the restoration devices, explained above in detail.

Let's consider the case wherein the conversion device or the restoration device according to the present invention is applied to the situation that, for example, the code blocks which are converted from the information blocks by the conversion device are transmitted to the restoration device via the transmission line and then the received code blocks are restored to the original information blocks by the restoration device. Since the simple device configuration is adopted in the present invention, the high speed operation can be easily affected. As a result, the operation of the device can be extremely stabilized even if the operating frequency of the code blocks is increased twice the operating frequency of the information blocks, so that no problem is caused.

Also, as an approach of reducing the electromagnetic interference (EMI) due to the high operating frequency, the driving of respective devices by the low voltage is implemented in the prior art. In the case of such low voltage driving, normally it is well known that the reception error due to variation in the direct current component is ready to occur. However, since the direct current component is completely removed in the present invention, there is no necessity that the above harmful influence due to the variation in the direct current component must be considered. As a result, the electromagnetic interference (EMI) due to the high operating frequency can be reduced without the reception error by driving respective devices by the low voltage.

The present invention is not limited to the above embodiments, and may be embodied as variations which are changed suitably within the appended claims.

More particularly, for example, in the above embodiments, the information alignment in the code blocks is explained such that, after the information are converted by the conversion device, the original information and the inverted information corresponding to the original information are positioned alternatively. But, the present invention is not limited to such embodiments. It is needless to say that the original information and the inverted information corresponding to the original information can be arranged freely to have any positional relation within the range of the code blocks acting as conversion objects.

More generally, it should be understood that many modifications and adaptations of the invention will become apparent to those skilled in the art and it is intended to encompass such obvious modifications and changes in the scope of the claims appended hereto.

What is claimed is:

1. A conversion method of converting sequentially information blocks, each of which is extracted sequentially from an information sequence and acts as a conversion unit, into code blocks, the method comprising steps of:

dividing the information blocks into a plurality of original subblocks;

generating a plurality of inverted subblocks containing inverted information by inverting all original information being allocated to one or more segments contained in the original subblocks while correlating the original subblocks with the inverted subblocks; and combining the plurality of original subblocks and the plurality of generated inverted subblocks together into the code blocks.

2. A conversion method according to claim 1, wherein each of the inverted subblocks is inserted between any original subblocks of the plurality of original subblocks when the plurality of original subblocks and the plurality of inverted subblocks are combined together.

3. A conversion method according to claim 1, wherein each of the inverted subblocks is inserted adjacent to the corresponding original subblock of the plurality of original subblocks when the plurality of original subblocks and the plurality of inverted subblocks are combined together.

4. A restoration method of restoring code blocks into information blocks, the code blocks being converted from the information blocks by dividing the information blocks each of which is extracted sequentially from an information sequence and acts as a conversion unit into a plurality of original subblocks, then generating a plurality of inverted subblocks containing inverted information by inverting all original information being allocated to one or more segments contained in the original subblocks while correlating the original subblocks with the inverted subblocks, and then combining the plurality of original subblocks and the plurality of generated inverted subblocks together into the code blocks, the method comprising the step of:

sampling the original information allocated to one or more segments contained in the original subblocks from the code blocks.

5. A restoration method according to claim 4, further comprising the steps of:

sampling the inverted information allocated to one of more segments contained in the inverted subblocks from the code blocks;

executing coincidence decision to decide whether or not at least one combination in which both information coincide with each other is present in a plurality of combinations of the sampled original information and the sampled inverted information corresponding to the sampled original information; and deeming that an abnormal condition is caused when at least one combination in which both information coincide with each other is present.

6. A restoration method according to claim 5, wherein the abnormal condition contains transmission error and restoration error.

7. A conversion device for converting sequentially information blocks, each of which is extracted sequentially from an information sequence and acts as a conversion unit, into code blocks, the device comprising:

a dividing means for dividing the information blocks into a plurality of original subblocks;

a generating means for generating a plurality of inverted subblocks containing inverted information by inverting all original information being allocated to one or more segments contained in the original subblocks while correlating the original subblocks with the inverted subblocks; and a combining means for combining the plurality of original subblocks and the plurality of generated inverted subblocks together into the code blocks.

8. A conversion device according to claim 7, wherein the combining means inserts each of the inverted subblocks between any original subblocks of the plurality of original subblocks when combining the plurality of original subblocks and the plurality of inverted subblocks together.

9. A conversion device according to claim 7, wherein the combining means inserts each of the inverted subblocks adjacent to the corresponding original subblock of the plurality of original subblocks when combining the plurality of original subblocks and the plurality of inverted subblocks together.

10. A restoration device for restoring code blocks into information blocks, the code blocks being converted from the information blocks by dividing the information blocks each of which is extracted sequentially from an information sequence and acts as a conversion unit into a plurality of original subblocks, then generating a plurality of inverted subblocks containing inverted information by inverting all original information being allocated to one or more segments contained in the original subblocks while correlating the original subblocks with the inverted subblocks, and then combining the plurality of original subblocks and the plurality of generated inverted subblocks together into the code blocks, the device comprising:

an original information sampling means for sampling the original information allocated to one or more segments contained in the original subblocks from the code blocks.

11. A restoration device according to claim 10, further comprising:

an inverted information sampling means for sampling the inverted information allocated to one or more segments contained in the inverted subblocks from the code blocks; and a coincidence deciding means for executing coincidence decision to decide whether or not at least one combination in which both information coincide with each other is present in a plurality of combinations of the original information sampled by the original information sampling means and the inverted information sampled by the inverted information sampling means corresponding to the original information;

wherein generation of an abnormal condition is deemed when at least one combination in which both information coincide with each other is present.

12. A restoration device according to claim 11, wherein the abnormal condition contains transmission error and restoration error.

* * * * *

UNITED STATES PATENT AND TRADEMARK OFFICE
CERTIFICATE OF CORRECTION

PATENT NO.     : 6,373,405 B1
DATED          : April 16, 2002
INVENTOR(S)    : Yoshinori Nakatsugawa It is certified that error appears in the above-identified patent and that said Letters Patent is hereby corrected as shown below:

<u>Column 15,</u>
Line 48, "one of" should read -- one or --

Signed and Sealed this

Twenty-fifth Day of February, 2003

JAMES E. ROGAN
*Director of the United States Patent and Trademark Office*